US012364169B2

(12) United States Patent
Cortiñas et al.

(10) Patent No.: US 12,364,169 B2
(45) Date of Patent: Jul. 15, 2025

(54) DRIVEN KERR NONLINEAR OSCILLATOR AND RELATED SYSTEMS AND METHODS

(71) Applicant: Yale University, New Haven, CT (US)

(72) Inventors: Rodrigo G. Cortiñas, New Haven, CT (US); Jayameenakshi Venkatraman, New Haven, CT (US); Xu Xiao, New Haven, CT (US); Nicholas Frattini, Lafayette, CO (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 18/872,628

(22) PCT Filed: Jun. 9, 2023

(86) PCT No.: PCT/US2023/024948
§ 371 (c)(1),
(2) Date: Dec. 6, 2024

(87) PCT Pub. No.: WO2024/054272
PCT Pub. Date: Mar. 14, 2024

(65) Prior Publication Data
US 2025/0169377 A1    May 22, 2025

Related U.S. Application Data

(60) Provisional application No. 63/351,068, filed on Jun. 10, 2022.

(51) Int. Cl.
*H10N 60/12*    (2023.01)
*G06N 10/40*    (2022.01)
*H10N 60/80*    (2023.01)

(52) U.S. Cl.
CPC ............. *H10N 60/12* (2023.02); *G06N 10/40* (2022.01); *H10N 60/805* (2023.02)

(58) Field of Classification Search
CPC ....... H10N 60/12; H10N 60/805; G06N 10/40
See application file for complete search history.

(56) References Cited

U.S. PATENT DOCUMENTS

| 6,627,915 B1 | 9/2003 | Ustinov et al. |
| 2018/0083599 A1 | 3/2018 | Kippenberg et al. |

(Continued)

FOREIGN PATENT DOCUMENTS

WO    WO 2020/068237 A1    4/2020

OTHER PUBLICATIONS

International Search Report and Written Opinion International Application No. PCT/US2023/024948 mailed Mar. 25, 2024.

(Continued)

*Primary Examiner* — Paul A Wartalowicz
(74) *Attorney, Agent, or Firm* — Wolf, Greenfield & Sacks, P.C.

(57) ABSTRACT

Techniques are describing for designing and operating a quantum oscillator. In contrast with conventional approaches to operating a quantum oscillator, the present techniques relate to an oscillator design that has less bare nonlinearity than is conventionally thought to be necessary for efficient operation. Moreover, the oscillator may be driven at a frequency that is detuned away from the frequency at which a nonlinear oscillator is typically driven. In particular, the detuned drive frequency may be substantially different from the typical drive frequency, and furthermore may be a frequency that may be expected to produce a low coherence time without also engineering the reduced nonlinearity described above. As a result, the combination of an engineered reduced nonlinearity combined with a detuned drive may result in a well behaved oscillator with a strong effective nonlinearity that exhibits significantly longer coherence times than conventional quantum oscillators.

27 Claims, 6 Drawing Sheets

(56) References Cited

U.S. PATENT DOCUMENTS

| | | | |
|---|---|---|---|
| 2021/0021245 A1 | 1/2021 | Frattini et al. | |
| 2021/0125096 A1* | 4/2021 | Puri | G06N 10/70 |
| 2021/0272008 A1* | 9/2021 | Oliver | H03K 17/92 |
| 2022/0103172 A1* | 3/2022 | Mundhada | G06N 10/40 |

OTHER PUBLICATIONS

Frattini et al., Observation of Pairwise Level Degeneracies and the Quantum Regime of the Arrhenius Law in a Double-Well Parametric Oscillator. Physical Review X. Sep. 3, 2024;14:031040(28).

Grimm et al., Stabilization and operation of a Kerr-cat qubit. Nature, Aug. 13, 2020;584(7820):205-11.

Hajr et al., High-Coherence Kerr-cat qubit in 2D architecture. Physical Review X. Oct. 1, 2024;14(4):041049(12-17).

Khan et al., Physical reservoir computing using finitely-sampled quantum systems. arXiv preprint arXiv:2110.13849. Oct. 26, 2021:1-38.

Lyama et al., Observation and manipulation of quantum interference in a superconducting Kerr parametric oscillator. Nature Communications. Jan. 2, 2024;15(1):86.

Marthaler et al., Quantum interference in the classically forbidden region: A parametric oscillator. Physical Review A. Jul. 20, 2007;76:010102(4).

Qing et al., Benchmarking Single-Qubit Gates on a Noise-Biased Qubit Beyond the Fault-Tolerant Threshold. arXiv preprint arXiv:2411.04442v1. Nov. 7, 2024. 19 pages.

Ruiz et al., Two-photon driven Kerr quantum oscillator with multiple spectral degeneracies. Physical Review A. Apr. 6, 2023;107:042407(10).

Venkatraman et al., A driven Kerr oscillator with two-fold degeneracies for qubit protection. Proceedings of the National Academy of Sciences. Jun. 5, 2024;121(24):e2311241121(9).

Zhang et al., Preparing quasienergy states on demand: A parametric oscillator. Physical Review A. May 16, 2017;95:053841(10).

\* cited by examiner

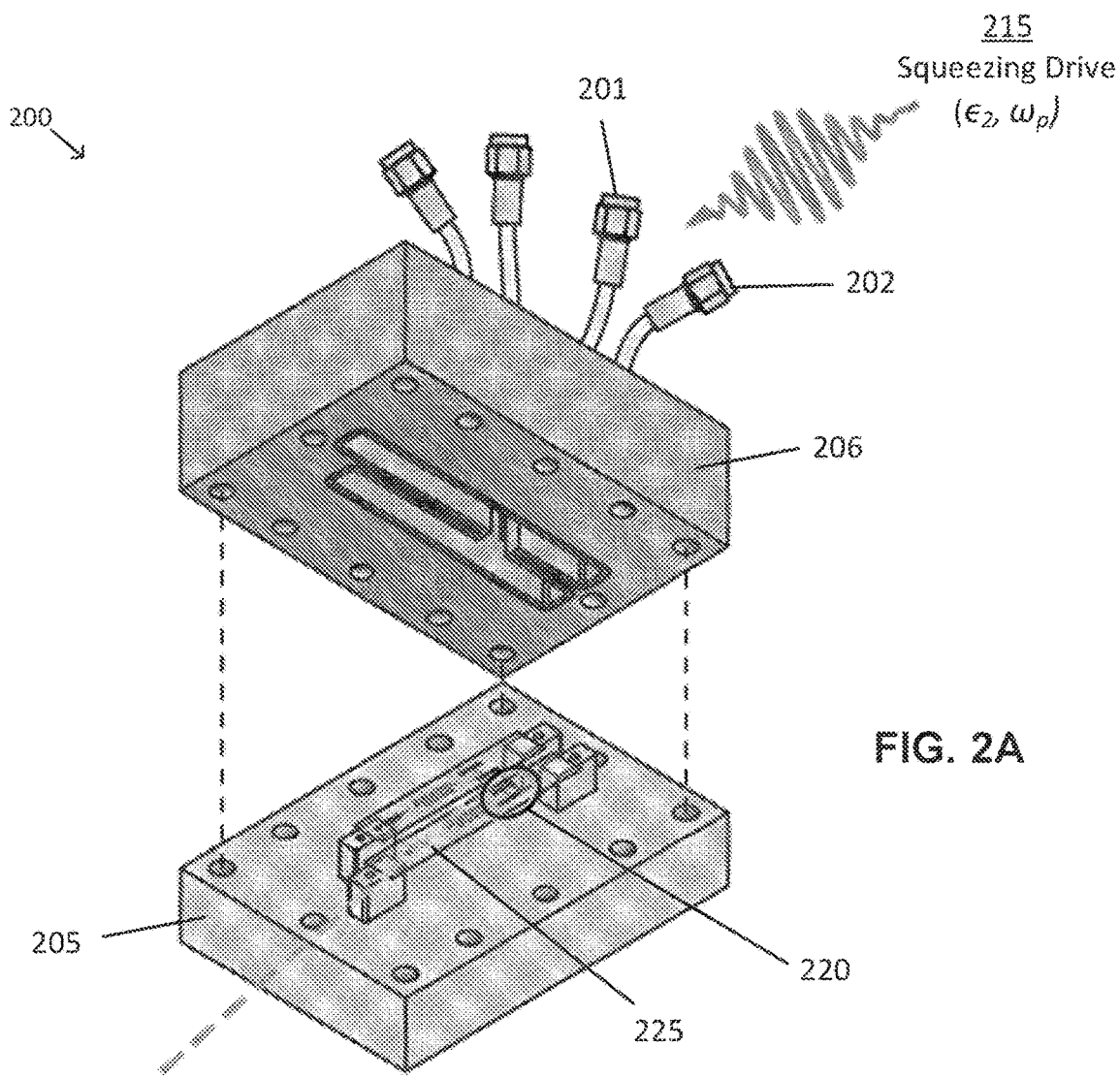
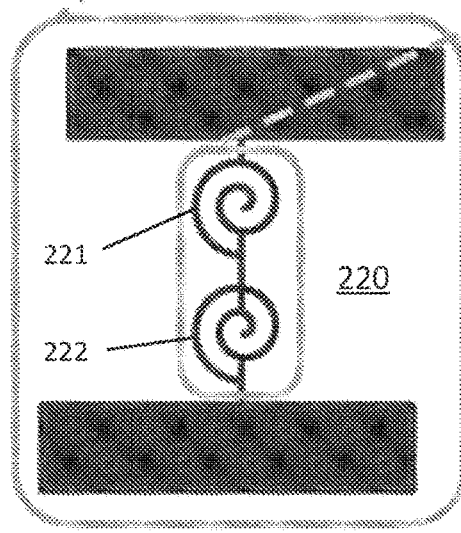
FIG. 2B
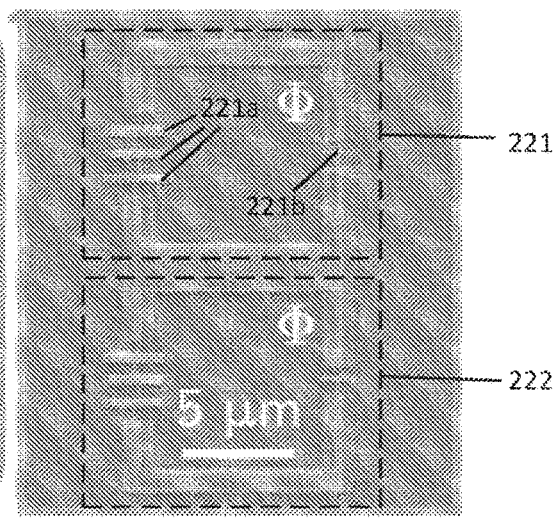
FIG. 2C

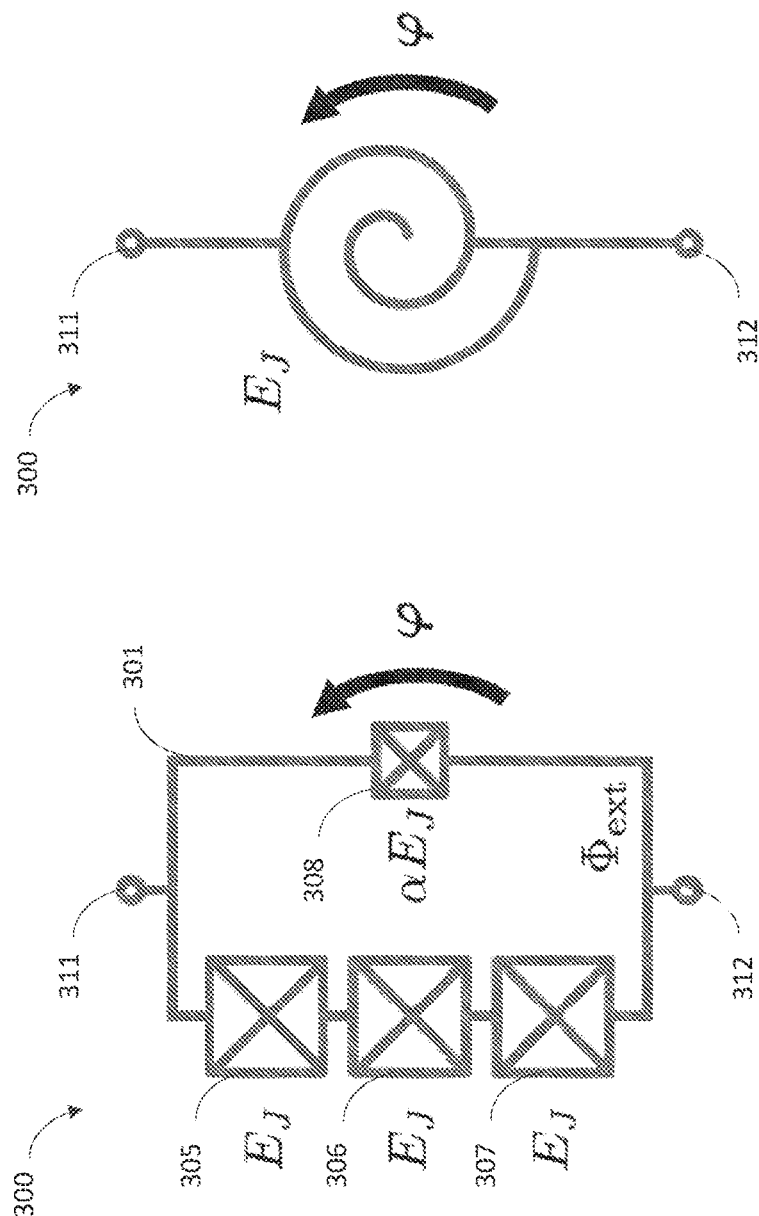

DRIVEN KERR NONLINEAR OSCILLATOR AND RELATED SYSTEMS AND METHODS

CROSS-REFERENCE TO RELATED APPLICATIONS

The present application is a national stage filing under 35 U.S.C. § 371 of International Patent Application Serial No. PCT/US2023/024948, filed Jun. 9, 2023, titled "DRIVEN KERR NONLINEAR OSCILLATOR AND RELATED SYSTEMS AND METHODS", which claims the benefit under 35 U.S.C. § 119(e) of U.S. Provisional Patent Application No. 63/351,068, filed Jun. 10, 2022, titled "Quantum Oscillator Techniques and Related Systems and Methods," each of which is hereby incorporated by reference in its entirety.

GOVERNMENT FUNDING

This invention was made with government support under W911NF-18-1-0212 awarded by the United States Army Research Office. The government has certain rights in the invention.

BACKGROUND

Quantum information processing techniques perform computation by manipulating one or more quantum objects. These techniques are sometimes referred to as "quantum computing." In order to perform computations, a quantum information processor utilizes quantum objects to reliably store, process and retrieve information. According to some quantum information processing approaches, a quantum analogue to the classical computing "bit" (being equal to 1 or 0) has been developed, which is referred to as a quantum bit, or "qubit." A qubit can be composed of any quantum system that has two distinct states (which may be thought of as 1 and 0 states), but also has the special property that the system can be placed into quantum superpositions and thereby potentially exist in both of those states at once.

A quantum system that can be manipulated and measured tends to interact with uncontrolled degrees of freedom in its environment leading to decoherence. This presents a challenge to the experimental investigation of quantum effects and in particular to the field of quantum computing, where qubits must remain coherent while operations are performed. Most noisy environments are only locally correlated and thus cannot decohere quantum information encoded in a non-local manner.

SUMMARY

Some embodiments are directed to a method of operating a circuit quantum electrodynamics (cQED) system. The method comprises operating at least one energy source to drive a Kerr oscillator at a frequency $\omega_p$, wherein the Kerr oscillator comprises a plurality of superconducting nonlinear asymmetric inductive elements (SNAILs) coupled to one another in series, each of the plurality of SNAILs comprising a plurality of first Josephson junctions coupled in series and a second Josephson junction coupled in parallel with the plurality of first Josephson junctions, each of the plurality of SNAILS having a transition frequency $\omega_q$, and wherein $\omega_p < 2\omega_q$.

In some embodiments, $\omega_p = 2\omega_q + 2\Delta$, wherein $\Delta$ is an integer multiple of $-2K$, wherein K is a Kerr nonlinearity of the plurality of SNAILs of the Kerr oscillator.

In some embodiments, the method further comprises operating the at least one energy source to drive a readout resonator at a frequency $\omega_r - (\omega_p/2)$ to thereby produce readout of a quantum state of the Kerr oscillator, wherein the readout resonator is coupled to the plurality of SNAILs of the Kerr oscillator and has a resonant frequency Jr.

In some embodiments, within each of the plurality of SNAILs, a tunneling energy of the second Josephson junction is less than a tunneling energy of each of the first Josephson junctions.

In some embodiments, each of the plurality of SNAILs comprises a superconducting ring connected between two nodes. The superconducting ring comprises a first ring portion comprising the plurality of first Josephson junctions connected in series, wherein each second Josephson junction of the plurality of second Josephson junctions has the same tunneling energy and a second ring portion comprising the second Josephson junction in parallel with the plurality of first Josephson junctions between the two nodes.

In some embodiments, the method further comprises operating one or more magnetic flux generation devices to generate an external DC magnetic flux through the superconducting ring of each of the plurality of SNAILs.

In some embodiments, the external DC magnetic flux is between $0.25\Phi_0$ and $0.50\Phi_0$, where $\Phi_0$ is the magnetic flux quantum.

In some embodiments, the frequency $\omega_q$ is between 5 GHz and 8 GHz.

In some embodiments, the frequency $\omega_q$ is between 5.5 GHz and 6.5 GHz.

In some embodiments, K is between 300 kHz and 400 kHz.

In some embodiments, K is between 310 kHz and 330 kHz.

Some embodiments are directed to a circuit quantum electrodynamics (cQED) system. The system comprises: a Kerr oscillator comprising a plurality of superconducting nonlinear asymmetric inductive elements (SNAILs) coupled to one another in series, each of the plurality of SNAILs comprising a plurality of first Josephson junctions coupled in series and a second Josephson junction coupled in parallel with the plurality of first Josephson junctions, each of the plurality of SNAILS having a transition frequency $\omega_q$; and an energy source configured to drive the plurality of SNAILs at a frequency $\omega_p$, wherein $\omega_p < 2\omega_q$.

In some embodiments, $\omega_p = 2\omega_q + 2\Delta$, wherein $\Delta$ is an integer multiple of $-2K$, wherein K is a Kerr nonlinearity of the plurality of SNAILs of the Kerr oscillator.

In some embodiments, the frequency $\omega_q$ is between 5 GHz and 8 GHz.

In some embodiments, K is between 300 kHz and 400 kHz.

In some embodiments, the system further comprises a readout resonator coupled to the plurality of SNAILs of the Kerr oscillator.

In some embodiments, the readout resonator has a resonant frequency $\omega_r$, and the energy source is further configured to drive the readout resonator at a frequency $\omega_r - \omega_p/2$ to thereby produce readout of a quantum state of the Kerr oscillator.

In some embodiments, the system further comprises a Purcell filter coupled to the plurality of SNAILs of the Kerr oscillator.

In some embodiments, within each of the plurality of SNAILs, the second Josephson junction is characterized by a superconducting phase difference, $\varphi$, wherein the SNAIL has a potential that varies as a function of the superconducting phase difference, φ, and has a single potential well, wherein the potential has a non-zero $\varphi^3$ term and a $\varphi^4$ term that is equal to zero.

In some embodiments, each of the plurality of SNAILs comprises two first Josephson junctions.

In some embodiments, within each of the plurality of SNAILs, the first Josephson junction is formed from two Dolan bridges.

In some embodiments, within each of the plurality of SNAILs, a tunneling energy of the second Josephson junction is less than a tunneling energy of each of the first Josephson junctions.

In some embodiments, wherein the tunneling energy of each first Josephson junction is $\epsilon_J$, and the tunneling energy of each second Josephson junction is $\alpha\epsilon_J$, where $\alpha$ is less than 0.50 and greater than 0.20.

In some embodiments, each of the plurality of SNAILs comprises a superconducting ring connected between two nodes, the superconducting ring comprising: a first ring portion comprising the plurality of first Josephson junctions connected in series, wherein each second Josephson junction of the plurality of second Josephson junctions has the same tunneling energy; and a second ring portion comprising the second Josephson junction in parallel with the plurality of first Josephson junctions between the two nodes.

In some embodiments, the system further comprises one or more magnetic flux generation devices configured to generate an external DC magnetic flux through the superconducting ring of the each of the plurality of SNAILs.

In some embodiments, the external DC magnetic flux generated by the one or more magnetic flux devices is between $0.25\Phi_0$ and $0.50\Phi_0$, where $\Phi_0$ is the magnetic flux quantum.

In some embodiments, the Kerr oscillator is formed on a sapphire chip suspended within a cavity.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 2A depicts an exploded view of an circuit QED implementation of a system comprising a Kerr nonlinear oscillator, according to some embodiments;

FIG. 2B depicts an illustrative implementation of a Kerr nonlinear oscillator comprising SNAILs, according to some embodiments;

FIG. 2C depicts an illustrative implementation of a Kerr nonlinear oscillator formed from an arrangement of Josephson junctions, according to some embodiments;

FIG. 3A is a schematic diagram of a superconducting nonlinear asymmetric inductive element (SNAIL), according to some embodiments;

FIG. 3B illustrates the circuit element symbol for the SNAIL of FIG. 3A;

DETAILED DESCRIPTION

Figure 1:
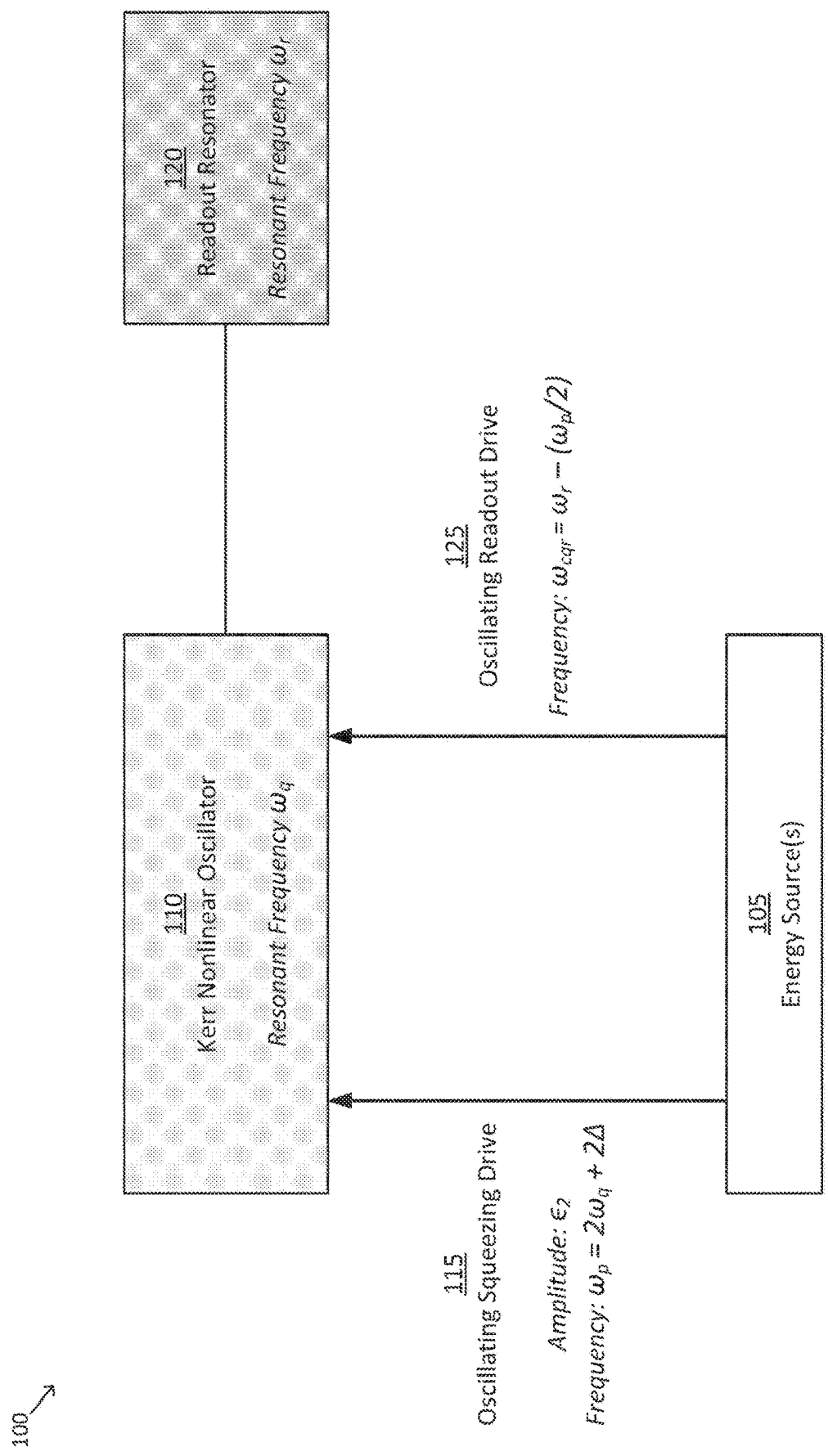
FIG. 1 is a block diagram of an illustrative quantum system suitable for practicing techniques described herein, according to some embodiments.

In some approaches to quantum computation, a quantum state of a bosonic system, such as a quantum oscillator, is arranged to encode the state of a qubit. The choice of how a two-level qubit state is represented by the state of the bosonic system is referred to as a "code." For instance, the two states of a qubit may be represented by the zero and one boson number states of the bosonic system, $|0\rangle$ and $|1\rangle$, respectively. The choice of the states of the bosonic system that represent the two states of the qubit may be referred to as the "codewords" for the selected code. While a selection of $|0\rangle$ and $|1\rangle$ as the codewords represents a perfectly valid code, it fails to be robust against many errors, such as boson loss. That is, when a boson loss occurs in the bosonic system, the state of the bosonic system prior to the boson loss may be unrecoverable with this code.

In general, the choice of code affects how robust the system is to errors, such that the code used determines to what extent a prior bosonic state can be faithfully recovered when an error occurs. A desirable code would be associated with a broad class of errors for which no information is lost when any of the errors occurs, and in which any quantum superposition of the encoded states can be faithfully recovered. Some codes, while robust against certain errors, may however be impractical to realize in a physical system.

One class of codes, referred to as "cat codes," have a desirable property that the state of a bosonic system storing a bit of quantum information using these codes is robust against boson loss errors. In particular, the cat codes utilize a set of logical codewords that encode a bit of quantum information in such a way that the loss of a boson produces a new state that is also one of the same sets of codewords. Furthermore, by non-destructively measuring a change in parity of the bosonic system, boson losses can be identified and corrected by transforming the state of the bosonic system back to the state prior to the loss.

Using the cat codes, a qubit may be represented by a multi-component coherent state of a bosonic oscillator:

$$|\psi\rangle = c_g |C_\alpha^-\rangle + c_e |C_\alpha^+\rangle$$

where $$|C_\alpha^-\rangle = \mathcal{N}(|\alpha\rangle + |-\alpha\rangle), \quad |C_\alpha^+\rangle = \mathcal{N}(|\alpha\rangle - |-\alpha\rangle),$$

$\mathcal{N}$ is a normalizing factor and $|\alpha\rangle$ denotes a coherent state of complex amplitude a, chosen such that $|\alpha\rangle$, $|-\alpha\rangle$, $|i\alpha\rangle$, $|-i\alpha\rangle$ are quasi-orthogonal.

These states have useful properties. First, when a boson is lost from the system (a type of error as described above), the states $|\psi_\alpha^{(n)}\rangle$ evolve to another one of the states $|\psi_\alpha^{(n)}\rangle$. That is, the set $\{|\psi_\alpha^{(n)}\rangle\}$ is closed under the action of the annihilation operator a. Second, in the absence of boson losses, the state deterministically evolves in a predictable manner. As a result, a unitary transformation can be found that is independent of $c_g$ and $c_e$ and which maps an evolved state that may or may not be the result of a boson loss back to the original state, thereby undoing the effect of decoherence. A boson loss can be identified, for instance, through a quantum non-destructive (QND) measurement of boson number parity.

Implementing a suitable bosonic system in such a way that the cat states can be realized is a promising approach for hardware efficient universal quantum computing. One such implementation may be based on a nonlinear oscillator, which can be implemented in a circuit quantum electrodynamics (circuit QED, or cQED) system. Nonlinear oscillators may exhibit bifurcation of states such that they can be implemented as qubits with the above-described cat codes. However, because of their sensitivity to undesirable interactions and photon loss, high-fidelity preparation and manipulation of these states may be challenging. In particular, the drives necessary to drive a nonlinear oscillator can have undesirable effects. Sufficiently strong drives, for example, may produce anomalous state transitions and/or may degrade gate operation fidelities.

The inventors have recognized and appreciated techniques for designing and operating a quantum oscillator. In contrast with conventional approaches to operating a quantum oscillator, the present techniques relate to an oscillator design that has less bare nonlinearity than is conventionally thought to be necessary for efficient operation. Moreover, the oscillator may be driven at a frequency that is detuned away from the frequency at which a nonlinear oscillator is typically driven. In particular, the detuned drive frequency may be substantially different from the typical drive frequency, and furthermore may be a frequency that may be expected to produce a low coherence time without also engineering the reduced nonlinearity described above. As a result, the combination of an engineered reduced nonlinearity combined with a detuned drive may result in a well behaved oscillator with a strong effective nonlinearity that exhibits significantly longer coherence times than conventional quantum oscillators.

According to some embodiments, a quantum oscillator as described herein may be a Kerr nonlinear oscillator. This oscillator is characterized by having a small oscillation frequency which changes by a particular frequency—the Kerr frequency—when an excitation quantum is added to the system. If the damping rate of the oscillator is well below this Kerr frequency, an time-varying drive applied to the oscillator at a particular frequency may bifurcate the ground state of the oscillator into the cat states described above, thereby allowing the Kerr nonlinear oscillator to be operated as a qubit exhibiting the cat states (the resulting oscillator may be referred to herein as a "Kerr-cat qubit," or simply a "Kerr-cat"). In particular, the techniques described herein realize specific drive frequencies at which a Kerr nonlinear oscillator (hereinafter, "Kerr oscillator") may exhibit states with particularly long coherence times that are also resilient to strong drive amplitudes.

According to some embodiments, an oscillating drive applied to a Kerr oscillator (this drive being also referred to herein as a "squeezing drive") may have a frequency that is selected to be one of a set of particular detuning frequencies that have been determined by the inventors to produce an oscillator with a desirably long coherence time. In some approaches, a Kerr oscillator may be driven at a drive frequency, $\omega'_p$, that is twice the transition frequency of the Kerr oscillator, $\omega_q$ (i.e., $\omega'_p = 2\omega_q$). Preferably, however, the Kerr oscillator may be driven at a frequency that is detuned from the frequency $2\omega_q$ by particular multiples of a detuning parameter $\Delta$. This drive frequency may be written herein as $\omega_p = 2\omega_q + 2\Delta$, wherein $\Delta = 2$ mK, where m is a positive or negative integer, and K is the Kerr nonlinearity of the Kerr oscillator.

According to some embodiments, the squeezing drive may have a frequency that is detuned below twice the transition frequency of the Kerr oscillator (i.e., $\Delta < 0$). The inventors have recognized that increasing the magnitude of $\Delta$ provides for a continuous reduction in the tunnelling amplitude between the cat states of the Kerr oscillator, and in addition increasing the magnitude of $\Delta$ specifically by multiples of 2K also provides for a discrete cancellation of tunnelling between the cat states. The inventors have further recognized, however, that the tunnelling amplitude is also strongly dependent upon the amplitude of the squeezing drive $\epsilon_2$ when $\Delta$ is positive, and only weakly dependent upon $\epsilon_2$ when $\Delta$ is negative. As a result, selecting negative values of $\Delta$ is particularly desirable as a squeezing drive having a frequency that is below $2\omega_q$ will increase the resilience of the ground state of the Kerr oscillator to detuning-like noise, even for higher amplitudes $\epsilon_2$ of the squeezing drive.

FIG. 1 is a block diagram of an illustrative quantum system suitable for practicing techniques described herein, according to some embodiments. System 100 comprises a Kerr oscillator 110 coupled to a readout resonator 120, and one or more energy sources 105 which may be operated to supply a drive (e.g., an electromagnetic wave drive, such as a microwave drive) to the Kerr oscillator 110. As shown in FIG. 1, the energy source(s) may be configured to supply at least a squeezing drive 115 and a readout drive 125 to the Kerr oscillator. These drives are described further below.

The Hamiltonian of a Kerr oscillator with the squeezing drive 115 applied may be written as:

$$\hat{H}/\hbar = -\Delta\hat{a}^\dagger\hat{a} - K\hat{a}^{\dagger 2}\hat{a}^2 + \epsilon_2(\hat{a}^{\dagger 2} + \hat{a}^2)$$

where $\hat{a}^\dagger$ and $\hat{a}$ are the creation and annihilation operators, respectively, for the oscillator, $\Delta$ is the detuning frequency, K is the Kerr nonlinearity of the oscillator, and $\epsilon_2$ is the amplitude of the squeezing drive. The amplitude and frequency of the squeezing drive may be adjusted to determine a desired value of the above Hamiltonian, which is completely determined by two dimensionless parameters: $\Delta/K$ and $\epsilon_2/K$, where the former is controlled by the frequency of the squeezing drive 115, and the latter is directly proportional to the amplitude of the squeezing drive. The eigenstates of this Hamiltonian are described further below.

As described above, the squeezing drive 115 may be provided with a frequency $\omega_p = 2\omega_q + 2\Delta$, where $\omega_q$ is the transition frequency of the Kerr oscillator 110. The transition frequency, $\omega_q$, of the Kerr oscillator 110 may be determined, for example, using two-tone spectroscopy. Two energy signals may be applied to the Kerr oscillator 110, including a probe tone with a frequency varied around an expected transition frequency of the Kerr oscillator 110 and a static tone used to monitor the Kerr oscillator 110. When the probe tone frequency approaches the transition frequency, $\omega_q$, the voltage response of the Kerr oscillator 110 is observed to decrease.

A suitable value of $\omega_p$ may therefore be selected through the selected value of $\Delta$. Desirable values of $\Delta$, as described further below, are $-2K$, $-4K$, $-6K$, . . . generalized as $-2$ mK where m=$-1$, $-2$, $-3$, . . . . Drive frequencies with these values of $\Delta$ produce multiple (m+1) degenerate states of the Kerr oscillator. In the case of zero detuning, $\Delta=0$, the ground state only is bifurcated, as described above. As $\Delta$ is increased in magnitude while negative, additional resonances are produced, independent of the amplitude $\epsilon_2$ of the squeezing drive. In particular, there are m+1 resonances for a given value of m (e.g., two resonances at $\Delta=0$, three resonances at $\Delta=-2K$, four resonances at $\Delta=-4K$, etc.).

Readout of the state of the Kerr oscillator 110 may be performed in system 100 by operating the readout drive 125, which is an oscillating drive applied to the Kerr oscillator. The readout drive 125 has a frequency $\omega_{cqr}$ that is equal to, or approximately equal to, the difference between the resonant frequency of the readout resonator and half of the frequency $\omega_p$ of the squeezing drive. That is, $\omega_{cqr}=\omega_r-\omega_p/2$ (or $\omega_{cqr}=\omega_p/2-\omega_r$ if the readout resonator has a resonant frequency that is less than half of the frequency of the squeezing drive). This drive induces a frequency converting beamsplitter interaction between the Kerr oscillator 110 and the readout resonator 120, transferring photons from the Kerr oscillator to the readout resonator. The transferred photons may be emitted from the readout resonator and collected with a quantum-limited measurement apparatus to read the cat state of the Kerr oscillator. If the amplitude $\epsilon_2$ of the squeezing drive is sufficiently large, the emitted photons are replenished by the squeezing drive to maintain self-oscillation within the Kerr oscillator, thereby making the cat state measurement quantum non-demolition (QND). The resonant frequency of the readout resonator is displaced conditioned on the cat state of the Kerr oscillator that is populated, and thus serves as a cat quadrature readout (CQR) scheme.

According to some embodiments, the Kerr oscillator may be implemented as a circuit quantum electrodynamics (cQED) system. For instance, system 100 may comprise a Kerr oscillator 110 comprising one or more nonlinear circuit elements, arranged with a resonant cavity (e.g., a microwave transmission line cavity), which is coupled to one or more ports for supplying one or more electromagnetic drives (e.g., microwave drives) 115 and 125 into the cavity to cause resonant behavior of the Kerr oscillator and readout resonator. The readout resonator may be implemented, for example, as a resonant structure mechanically supported within the cavity (e.g., a suspended resonator comprising a thin superconducting film coating a dielectric substrate), or as a stripline resonator.

According to some embodiments, the Kerr oscillator may comprise a plurality of nonlinear components. The nonlinear elements may include any suitable nonlinear elements, including but not limited to superconducting nonlinear asymmetric inductive elements (SNAILs, described further below), superconducting quantum interference devices (SQUIDs), cold atoms controlled by an optical tweezer system, Josephson junctions, and/or any other suitable components. In some embodiments, the plurality of nonlinear components may be coupled together in series. Coupling nonlinear component together in this manner may produce an oscillator with less bare nonlinearity than may be conventionally considered advantageous; however, as described above, the inventors have recognized that nonetheless such an oscillator has desirable properties when driven in a particular manner.

According to some embodiments, the energy source 105 includes any source(s) of energy, including one or more sources of electromagnetic radiation, which may be arranged to direct the squeezing drive and/or readout drive to the Kerr oscillator 110. Each of these drives may be operated independently or simultaneously by the energy source. In some embodiments, the energy source may comprise a laser or a microwave emitter. The energy source 105 may be coupled to the Kerr oscillator 110 via any suitable components, such as via one or more transmission lines (e.g., striplines and/or waveguides). The readout resonator 120 may be coupled to the Kerr oscillator 110 via any suitable coupling, including but not limited to electromagnetic coupling, piezoelectric coupling, and/or magnetostrictive coupling. In some cases the readout resonator and Kerr oscillator may be dispersively coupled.

According to some embodiments, the energy source(s) 105 may be configured to apply one or more drives, in addition to the squeezing drive and the readout drive, to the Kerr oscillator to manipulate the state of the oscillator (e.g., to prepare a desired quantum state, to perform quantum gates on the state, etc.).

In some embodiments, the Kerr oscillator 110, when driven by squeezing drive 115, may exhibit a coherence time of equal to or greater than 1 millisecond, 5 milliseconds, 10 milliseconds, 20 milliseconds, 50 milliseconds, 100 milliseconds, 200 milliseconds, 500 milliseconds, 1000 milliseconds, or 1250 milliseconds. In some embodiments, the Kerr oscillator 110, when driven by squeezing drive 115, may exhibit a coherence time of less than or equal to 1000 milliseconds, 500 milliseconds, 200 milliseconds, 100 milliseconds, 50 milliseconds, 20 milliseconds, or 10 milliseconds. Any suitable combinations of the above-referenced ranges are also possible (e.g., a coherence time of greater or equal to 500 milliseconds and less than or equal to 1000 milliseconds). In some embodiments, the readout fidelity of the Kerr oscillator 110, when driven by squeezing drive 115, may also be greater than 99%.

FIG. 2A depicts an exploded view of a circuit QED implementation of a system comprising a Kerr nonlinear oscillator, according to some embodiments. The example of FIG. 2A illustrates one way to implement portions of system 100 shown in FIG. 1. In the example of FIG. 2A, system 200 comprises a resonant cavity formed from upper and lower portions 205 and 206. Inside the cavity is suspended a sapphire chip on which is formed a Kerr oscillator 220 and readout resonator 225. Ports 201 and 202 provide a mechanism for a coupled energy source (e.g., microwave emitter) to direct energy into the cavity at a desired amplitude and frequency (e.g., to input a squeezing drive 215 and/or a readout drive, not shown).

In some embodiments, the package of system 200 may comprise a Purcell filter. The Purcell filter may be provided to protect the Kerr-cat qubit from spontaneous emission while maintaining a strong coupling to the cavity. According to some embodiments, the Purcell filter may comprise with two V/4 open-circuited transmission-line stubs.

In some embodiments, the transition frequency $\omega_q$ of the Kerr oscillator 220 may be greater than or equal to 5 GHz, 5.5 GHz, 5.8 GHz, 6.0 GHz, 6.1 GHz, 6.2 GHz, 6.3 GHz or 6.5 GHz. In some embodiments, the transition frequency $\omega_q$ of the Kerr oscillator 220 may be less than or equal to 7 GHz, 6.5 GHz, 6.4 GHz, 6.3 GHz, 6.2 GHz, 6.1 GHz, 6.0 GHz or 5.9 GHz. Any suitable combinations of the above-referenced ranges are also possible (e.g., a transition frequency $\omega_q$ of greater or equal to 6.0 GHz and less than or equal to 6.4 GHz, etc.).

In some embodiments, the resonant frequency $\omega_r$ of the readout resonator 225 may be greater than or equal to 8 GHz, 8.2 GHz, 8.4 GHz, 8.6 GHz or 8.8 GHz. In some embodiments, the resonant frequency $\omega_r$ of the readout resonator 225 may be less than or equal to 9 GHz, 8.8 GHz, 8.6 GHz, 8.4 GHz or 8.2 GHz. Any suitable combinations of the above-referenced ranges are also possible (e.g., a resonant frequency φr of the readout resonator of greater or equal to 8.4 GHz and less than or equal to 8.6 GHz, etc.).

In some embodiments, the Kerr nonlinearity K of the Kerr oscillator 220 may be greater than or equal to 100 kHz, 200 kHz, 300 kHz, 320 kHz, 350 kHz or 400 kHz. In some embodiments, the Kerr nonlinearity K of the Kerr oscillator 220 may be less than or equal to 350 kHz, 330 kHz, 320 kHz, 300 kHz, 250 kHz or 200 kHz. Any suitable combinations of the above-referenced ranges are also possible (e.g., a Kerr nonlinearity K of greater or equal to 300 kHz and less than or equal to 330 kHz, etc.). Depending on the implementation of the Kerr oscillator, it may also be feasible to operate a Kerr oscillator that has a Kerr nonlinearity K that is above 10 MHz or above 20 MHz.

The Kerr nonlinearity K of a Kerr oscillator may be measured in various ways, including by supplying a probe tone to the Kerr oscillator while varying the frequency of the probe tone. When the probe tone excites the oscillator, the readout signal produced from the coupled readout resonator changes due to the coupling between the Kerr oscillator and readout resonator. Resonances corresponding to a two-photon transition that excite the oscillator from g (ground state) to f (second excited state) and to a resonant excitation of the oscillator from g to e (first excited state). The gf/2 and ge resonances are located at frequencies $(\omega_q-K)/2\pi$ and $\omega_q/2\pi$ respectively. Accordingly, by measuring the frequencies of these resonances using the probe tone, K may be determined.

In some embodiments, the frequency op of the squeezing drive 215 may be greater than or equal to 10 GHz, 11 GHz, 11.5 GHz, 12 GHz, 12.2 GHz, 12.4 GHz, 12.6 GHz or 13 GHz. In some embodiments, the frequency $\omega_p$ of the squeezing drive 215 may be less than or equal to 14 GHz, 13 GHz, 12.8 GHz, 12.6 GHz, 12.4 GHz, 12.2 GHz, 12 GHz or 11.8 GHz. Any suitable combinations of the above-referenced ranges are also possible (e.g., a frequency $\omega_p$ of greater or equal to 12.4 GHz and less than or equal to 12.8 GHz, etc.).

According to some embodiments, the frequency $\omega_{cqr}$ of the readout drive may be greater than or equal to 2 GHz, 2.1 GHz, 2.2 GHz, 2.3 GHz, 2.4 GHz, 2.5 GHz, 2.6 GHz or 2.7 GHz. In some embodiments, the frequency $\omega_p$ of the squeezing drive 215 may be less than or equal to 2.8 GHz, 2.7 GHz, 2.6 GHz, 2.5 GHz, 2.4 GHz, 2.3 GHz, 2.2 GHz or 2.1 GHz. Any suitable combinations of the above-referenced ranges are also possible (e.g., a frequency $\omega_{cqr}$ of greater or equal to 2.2 GHz and less than or equal to 2.4 GHz, etc.).

In some embodiments, the amplitude $\epsilon_2$ of the squeezing drive 215 may be greater than or equal to 1K, 2K, 3K, 5K, 10K or 15K. In some embodiments, the amplitude $\epsilon_2$ of the squeezing drive 215 may be less than or equal to 20K, 15K, 12K, 10K, 8K or 5K. Any suitable combinations of the above-referenced ranges are also possible (e.g., an amplitude $\epsilon_2$ of greater or equal to 3K and less than or equal to 15K, etc.).

FIGS. 2B and 2C depict further detail of the illustrative implementation shown in FIG. 2A. In particular, in the example of FIGS. 2B and 2C, the Kerr oscillator 220 is implemented as two SNAILs 221 and 222, arranged in series. Each of these SNAILs, as described further below, is formed from a superconducting loop arranged between two nodes, wherein one side of the loop includes a plurality of Josephson junctions arranged in series, and wherein the other side of the loop includes a single Josephson junction. For example, as shown in FIG. 2C, the SNAIL 221 includes three Josephson junctions 221a on the left side of the superconducting loop, and a single Josephson junction 221b on the right side of the superconducting loop. In addition, an external DC magnetic flux $\Phi$ is produced and threaded through the superconducting loop of each SNAIL.

FIG. 3A is a schematic diagram of a SNAIL 300, according to some embodiments. The SNAIL 300 includes a superconducting ring 301 with two nodes 311 and 312. There are two paths along two different portions of the superconducting ring 301 that connect the first node 311 and the second node 312.

The first ring portion includes multiple Josephson junctions 305, 306 and 307 connected in series. In some embodiments, there are no other circuit elements between one Josephson junction and the next Josephson junction. For example, a Josephson junction is a dipole circuit element (i.e., it has two nodes). A first node of a first Josephson junction 305 may be directly connected to the first node 311 of the SNAIL, which may lead to some other external circuit element (not shown), a second node of the first Josephson junction 305 may be directly connected to a first node of a second Josephson junction 306, and a second node of the second Josephson junction 306 may be directly connected to a first node of a third Josephson junction 307. A second node of the third Josephson junction 307 is directly connected to a second node 312 of the SNAIL, which may lead to some other external circuit element (not shown).

While FIG. 3A illustrates the first ring portion including three Josephson junctions, any suitable number of Josephson junctions greater than one may be used. For example, two, three, four, five, six, or seven Josephson junctions may be used. In some embodiments, Josephson junctions 305, 306 and 307 are formed to be identical in some manner. For example, one or more of (including all of): the tunneling energies, the critical current, and the size of the Josephson junctions 305, 306 and 307 may be the same.

The second ring portion of the SNAIL 300 includes a single Josephson junction 308. In some embodiments, there are no other circuit elements in the second ring portion. For example, a first node of a single Josephson junction 308 may be directly connected to the first node 311 of the SNAIL, which may lead to some other external circuit element (not shown), and a second node of the single Josephson junction 308 may be directly connected to the second node 312 of the SNAIL, which may lead to some other external circuit element (not shown).

In the SNAIL 300, the single Josephson junction 308 has a smaller tunneling energy than each of Josephson junctions 305, 306 and 307. For this reason, the single Josephson junction 308 may be referred to as a "small" Josephson junction and Josephson junctions 305, 306 and 307 may be referred to as "large" Josephson junctions. The terms "large" and "small" are relative terms that are merely used to label the relative size of Josephson junction 308 as compared to Josephson junctions 305, 306 and 307. The Josephson energy and the Josephson junction size are larger in the large Josephson junction than in the small Josephson junction. The parameter a is introduced to represent the ratio of the small Josephson energy to the large Josephson energy. Thus, the Josephson energy of the large Josephson junctions 305, 306 and 307 is $E_J$ and the Josephson energy of the small Josephson junction 308 is $\alpha E_J$, where $0 > \alpha < 1$.

FIG. 3B illustrates the circuit element symbol for the SNAIL 300. The parameters that characterize the SNAIL 300 are the Josephson energy $E_J$ and the superconducting phase difference, $\varphi$, of the small Josephson junction 308. Of note is the fact that the SNAIL 300 has only two nodes 311 and 312.

The SNAIL 300 may controlled at least in part by threading a DC magnetic flux $\Phi_{ext}$ through the superconducting ring 301. In some embodiments, a magnetic flux generation device (not shown) may be positioned in proximity to the superconducting ring. For example, an electrical coil may be formed in proximity to the ring 301. The coil may be next to the ring 301 and in the same plane as ring 301. Alternatively, a coil may be under the ring 301 in a different layer of the device 300.

As described above, any number of large Josephson junctions may be used in the SNAIL 300. For a SNAIL with n large Josephson junctions, the SNAIL has an inductive energy given by:

$$U_{SNAIL}(\varphi) = -\alpha E_J \cos(\varphi) - nE_J \cos\left(\frac{\varphi_{ext} - \varphi}{n}\right)$$

where $\varphi$ is the superconducting phase across the single small Josephson junction 308, $\varphi_{ext} = 2\pi\Phi_{ext}/\Phi_0$ is the reduced applied magnetic flux, and $\Phi_0 = h/2e$ is the magnetic flux quantum. The above equation indicates that the potential is a function of a single degree of freedom ($\varphi$). This is because dynamics due to any intra-array modes are eliminated and only common excitations across the array of n Josephson junctions are considered. This reduction is valid when $E_J \gg E_C$ for each junction, where $E_C = e^2/2C_J$ is the Coulomb charging energy of the junction with capacitance $C_J$, and when $C_0 \ll C_J/n^2$, where $C_0$ is the capacitance to ground of each island between junctions. Some embodiments meet all of these requirements.

In some embodiments, the parameters $\alpha$ and $\Phi_0$ may be selected such that the SNAIL 300 has properties desirable for its application. For example, for $\alpha \sim 0.8$ and $\Phi_{ext} \sim 0.5\Phi_0$, the SNAIL 300 will have a double-well potential, which is undesirable due to the resulting hysteresis affects. But the parameters can be adjusts to create a potential with a single minimum. Moreover, the potential may simultaneously be tuned to cancel the fourth-order (Kerr) term while keeping a substantial cubic term.

To select desirable parameters, the potential $U_{SNAIL}(\varphi)$ may be Taylor expanded about its minimum value $\phi_{min}$ to obtain the effective potential for $\tilde{\varphi} = \varphi - \varphi_{min}$.

$$\frac{U_{eff}(\tilde{\varphi})}{E_J} = c_2\tilde{\varphi}^2 + c_3\tilde{\varphi}^3 + c_4\tilde{\varphi}^4 + \ldots$$

where ($c_2$, $c_3$, $c_4$, . . . ) are numerically determinable coefficients whose specific values depend on n (which is three in the illustrated embodiments), a, and (ext.

In some embodiments, to obtain a pure cubic nonlinearity without any Kerr (e.g., quartic) nonlinearity, the parameters $\alpha$ and $\Phi_{ext}$ are selected such that $c_3 \neq 0$ and $c_4 = 0$. It is noted that for n=1 (e.g., a SQUID) $c_3 = 0$ because the potential is a pure cosine irrespective of the values of $\alpha$, and $\Phi_{ext}$. Additionally, in the limit $n \gg 1$, the array of multiple large Josephson junctions act as a linear inductance and the potential approaches that of a fluxonium qubit/RF SQUID regime. While embodiments may include any number of large Josephson junctions so long as n>1 and the number is not in the regime where $n \gg 1$, the example described herein is focused on the case where n=3. Embodiments are not however, limited to this example implementation.

Returning to FIGS. 2A-2C, the magnetic flux $\Phi$ threaded through the SNAILs 221 and 222 may be, in some embodiments, greater than or equal to $0.25\Phi_0$, $0.3\Phi_0$, $0.35\Phi_0$, $0.4\Phi_0$, $0.45\Phi_0$ or $0.5\Phi_0$. In some embodiments, the magnetic flux $\Phi$ threaded through the SNAILs 221 and 222 may be less than or equal to $0.5\Phi_0$, $0.45\Phi_0$, $0.4\Phi_0$, $0.35\Phi_0$, $0.3\Phi_0$ or $0.25\Phi_0$. Any suitable combinations of the above-referenced ranges are also possible (e.g., a magnetic flux $\Phi$ of greater or equal to $0.3\Phi_0$ and less than or equal to $0.35\Phi_0$, etc.).

As described above, driving a Kerr oscillator with a squeezing drive having a frequency $\omega_p = 2\omega_q + 2\Delta$ where $\Delta = -2$ mK; m=$-1$, $-2$, $-3$, . . . produces m+1 degenerate states of the Kerr oscillator.

Figure 4A:
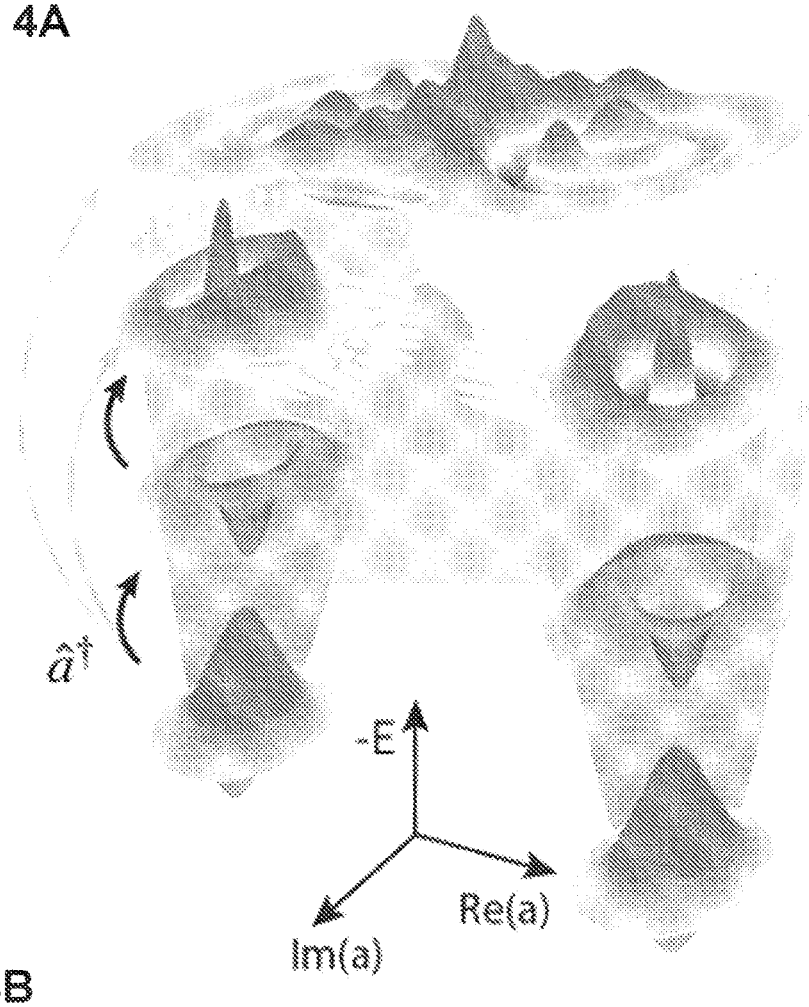
FIG. 4A depicts a phase space representation of the cat states of a Kerr nonlinear oscillator when $\Delta=0$, according to some embodiments.

FIG. 4A depicts a phase space representation of the cat states of a Kerr nonlinear oscillator when $\Delta = 0$, according to some embodiments. When the frequency of the squeezing drive is selected such that $\Delta = 0$, the ground state of the system is doubly degenerate and spanned by the even/odd Schrödinger cat states $|\mathcal{C}_\alpha^\pm\rangle \propto |+\alpha\rangle \pm |-\alpha\rangle$, where $|\alpha|^2 = \epsilon_2/K$. These ground states define the Kerr-cat qubit states $|\pm Z\rangle = |\mathcal{C}_\alpha^\pm\rangle$ with Wigner functions shown in FIG. 3B for $|\alpha|^2 = 8.5$. Their superpositions $|\pm\rangle X \approx |\pm\alpha\rangle$ are also ground states and, in the lab frame, correspond to robust self-oscillations in a period-doubled bifurcation of the circuit.

Figure 4B:
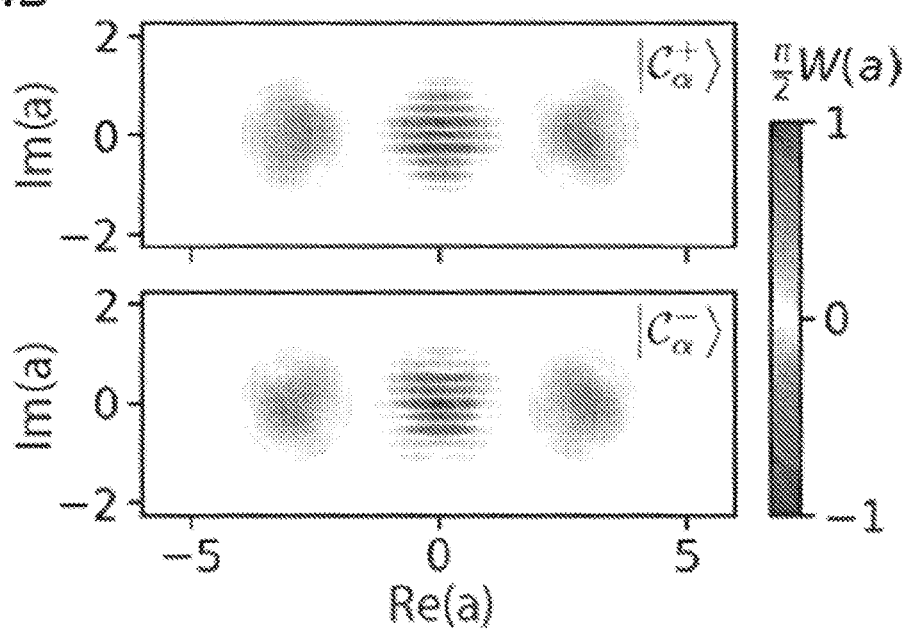
FIG. 4B illustrates Wigner functions of the even/odd superpositions of the two degenerate ground states of a Kerr nonlinear oscillator, according to some embodiments.

The Kerr oscillator depicted in FIGS. 4A-4B may, when implemented as a cQED system such as that shown in FIGS. 2A-2C, exhibit a coherence lifetime on the order of hundreds of microseconds. A loss of coherence may be observed when the squeezing drive frequency is adjusted away from $\omega_p = 2\omega_q$, due to tunnelling between the cat states. This tunnelling may be suppressed to some degree with a sufficiently strong squeezing drive amplitude (e.g., $\epsilon_2/K > 3$).

It was, however, recognized by the inventors that the coherence lifetime may be increased dramatically when $\Delta$ is sufficiently large, when compared with the coherence lifetime in the case of $\Delta = 0$. For example, the coherence lifetime when $\Delta = -2$ mK may be on the order of hundreds of milliseconds—an increase in coherence time of roughly one thousand.

Figure 5A:
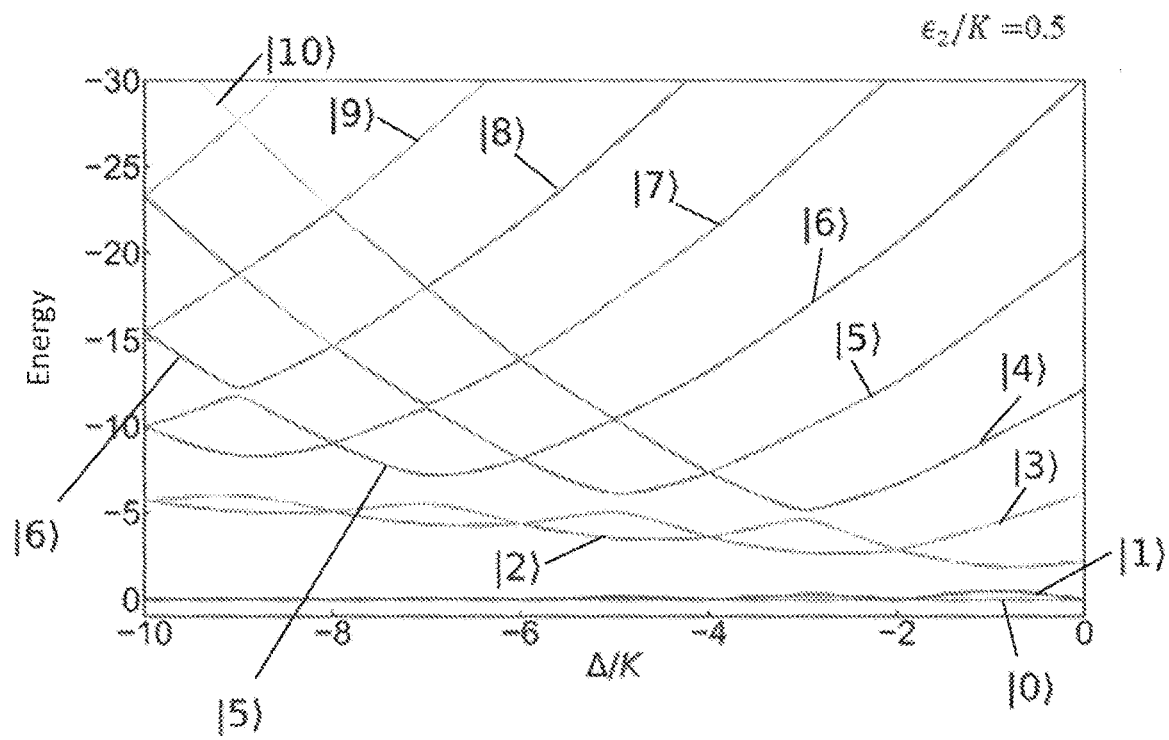
FIGS. 5A-5B illustrate quantum spectra of a Kerr nonlinear oscillator as a function of the detuning $\Delta$, according to some embodiments.
Figure 5B:
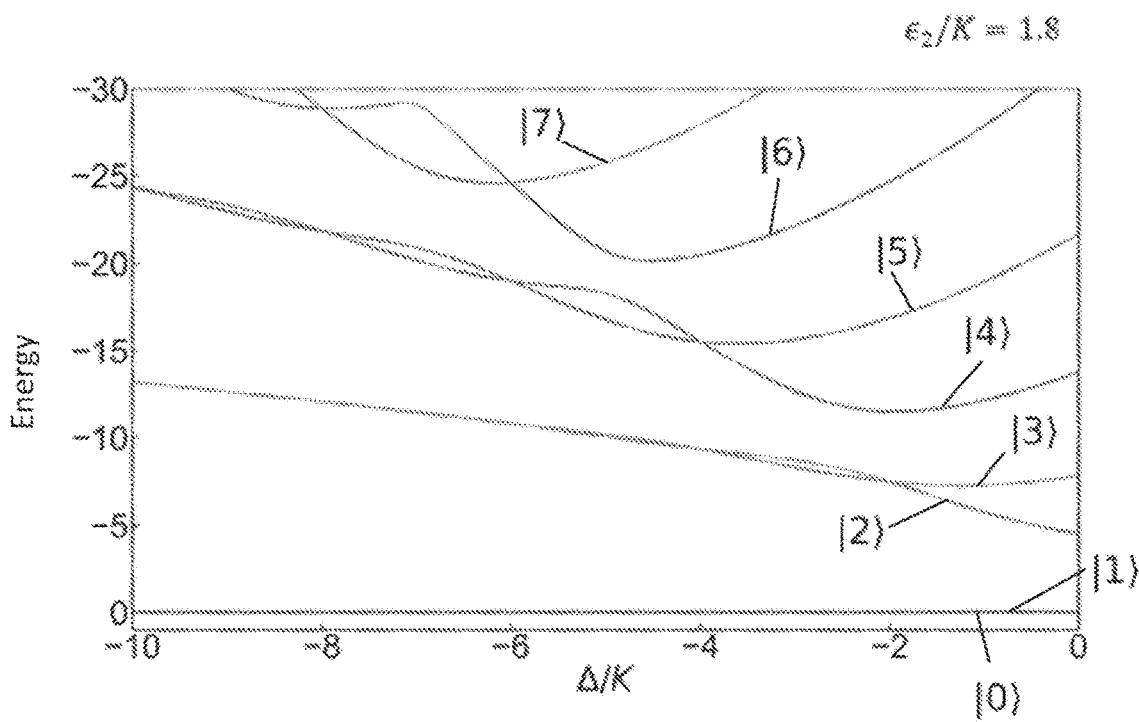

This phenomenon is depicted in FIGS. 5A-5B, which illustrate quantum spectra of a Kerr nonlinear oscillator as a function of the detuning $\Delta$, according to some embodiments. In the example of FIGS. 5A-5B, the energy of various states of the Kerr oscillator are depicted as a function of $\Delta/K$. The difference between FIGS. 5A and 5B is in the value of $\epsilon_2$, wherein $\epsilon_2/K = 0.5$ in the case of FIG. 5A, and $\epsilon_2/K = 1.8$ in the case of FIG. 5B.

Focusing on FIG. 5A, it may be noted that the states $|0\rangle$ and $|1\rangle$ are degenerate at $\Delta = 0$, as described above and shown in FIGS. 4A-4B. When $\Delta$ is reduced below zero, these states are no longer degenerate, and the energy levels of higher order states also decrease, except for $|2\rangle$. However, when $\Delta$ is reduced sufficiently, a new degenerate set of states emerges at $\Delta/K = -2$. In particular, once again the states $|0\rangle$ and $|1\rangle$ are degenerate, but also the states $|2\rangle$ and $|3\rangle$ are degenerate. Similarly, when the frequency of the squeezing drive is selected so that $\Delta/K = -4$, the states $|0\rangle$ and $|1\rangle$ are degenerate, the states |2⟩ and |3⟩ are degenerate, and the states |4⟩ and |5⟩ are degenerate. As such, there are m+1 degenerate pairs of states when Δ/K=−2 m.

Increasing the squeezing drive amplitude provides for deeper potential wells of the cat states, especially at higher values of Λ, leading to smaller tunnelling probabilities and thereby longer coherence times. This phenomenon is shown in FIG. 6, which depicts time-domain measurements of Rabi oscillations of the inter-well tunneling probability between cat states of a Kerr nonlinear oscillator, for a selection of squeezing drive amplitudes.

Figure 6:
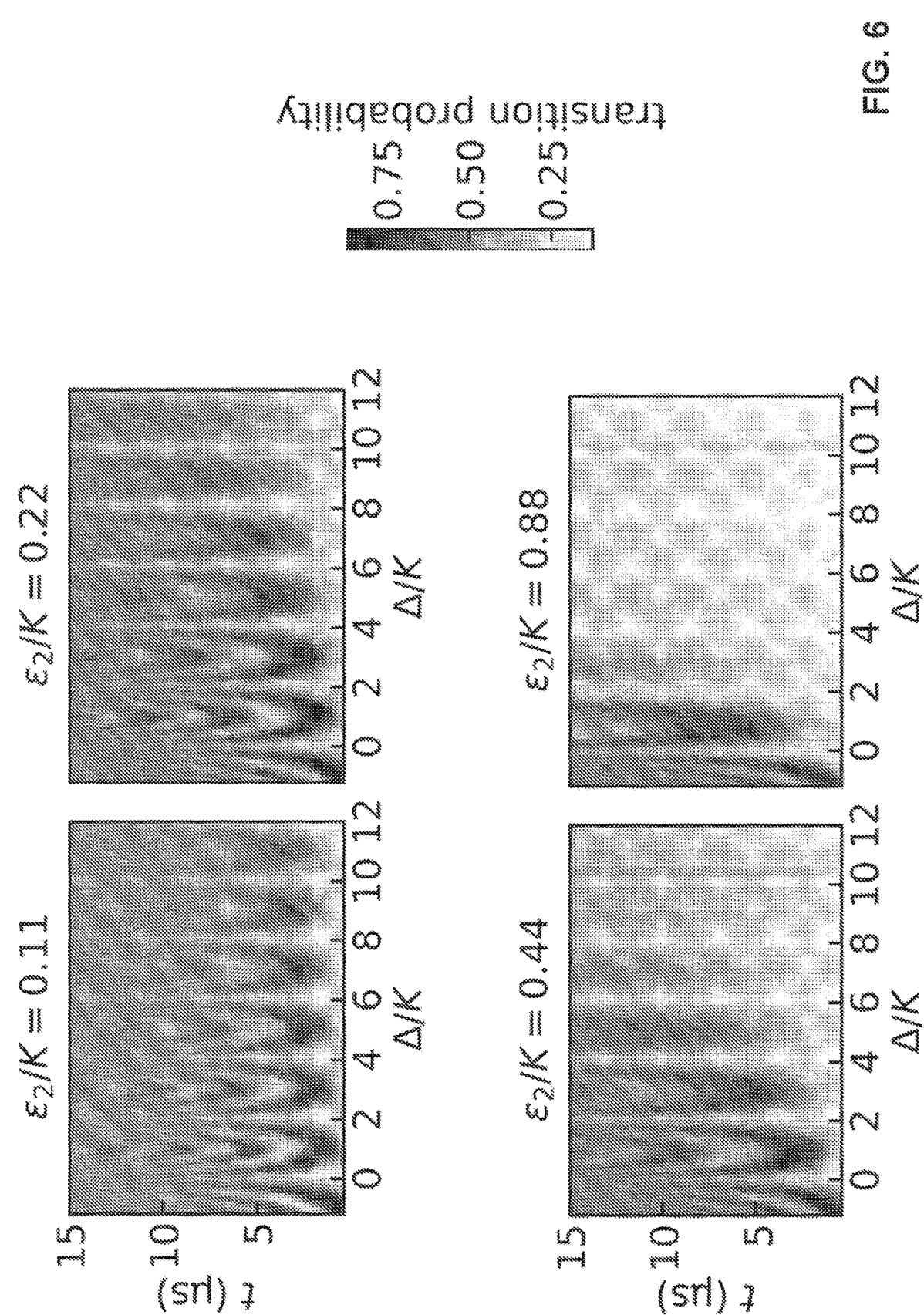
FIG. 6 depicts time-domain measurements of Rabi oscillations of the inter-well tunneling probability between cat states of a Kerr nonlinear oscillator, for a selection of squeezing drive amplitudes, according to some embodiments.

In the example of FIG. 6, the transition probability between cat states due to tunnelling is depicted for four different squeezing drive amplitudes. The periodic cancellation of tunneling at Δ/K=−2 m is clearly visible as the vertical white bands, which indicates a low transition probability over time. Whereas, for instance, a Kerr oscillator driven by a squeezing drive with a frequency slightly deviating from $\omega_p=2\omega_q$ (e.g., deviating less than K) reaches a high transition probability within a microsecond (e.g., see the dark bands around Δ/K~0.1 at times of less than 1 μs), a Kerr oscillator driven by a squeezing drive with a frequency of Δ/K=−2 m retains a low transition probability for much longer time periods, especially at higher drive amplitudes.

Having thus described several aspects of at least one embodiment of this invention, it is to be appreciated that various alterations, modifications, and improvements will readily occur to those skilled in the art.

Such alterations, modifications, and improvements are intended to be part of this disclosure and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±5% of a target value in some embodiments, within ±2% of a target value in some embodiments, within ±1% of a target value in some embodiments, and yet within ±0.5% of a target value in some embodiments. The terms "approximately" and "about" may include the target value. The term "substantially equal" may be used to refer to values that are within ±5% of one another in some embodiments, within ±2% of one another in some embodiments, within ±1% of one another in some embodiments, and yet within ±0.5% of one another in some embodiments.

The term "substantially" may be used to refer to values that are within ±5% of a comparative measure in some embodiments, within ±2% in some embodiments, within ±1% in some embodiments, and yet within ±0.5% in some embodiments. For example, a first direction that is "substantially" perpendicular to a second direction may refer to a first direction that is within ±5% of making a 90° angle with the second direction in some embodiments, within ±2% of making a 90° angle with the second direction in some embodiments, within ±1% of making a 90° angle with the second direction in some embodiments, and yet within ±0.5% of making a 90° angle with the second direction in some embodiments.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a circuit quantum electrodynamics (cQED) system, the method comprising:
   operating at least one energy source to drive a Kerr oscillator at a frequency $\omega_p$,
   wherein the Kerr oscillator comprises a plurality of superconducting nonlinear asymmetric inductive elements (SNAILs) coupled to one another in series, each of the plurality of SNAILs comprising a plurality of first Josephson junctions coupled in series and a second Josephson junction coupled in parallel with the plurality of first Josephson junctions, each of the plurality of SNAILS having a transition frequency $\omega_q$, and
   wherein $\omega_p<2\omega_q$.

2. The method of claim 1, wherein $\omega_p=2\omega_q+2\Delta$, wherein Δ is an integer multiple of −2K, wherein K is a Kerr nonlinearity of the plurality of SNAILs of the Kerr oscillator.

3. The method of claim 1, further comprising operating the at least one energy source to drive a readout resonator at a frequency $\omega_r-(\omega_p/2)$ to thereby produce readout of a quantum state of the Kerr oscillator, wherein the readout resonator is coupled to the plurality of SNAILs of the Kerr oscillator and has a resonant frequency $\omega_r$.

4. The method of claim 1, wherein, within each of the plurality of SNAILs, a tunneling energy of the second Josephson junction is less than a tunneling energy of each of the first Josephson junctions.

5. The method of claim 1, wherein each of the plurality of SNAILs comprises a superconducting ring connected between two nodes, the superconducting ring comprising:

a first ring portion comprising the plurality of first Josephson junctions connected in series, wherein each second Josephson junction of the plurality of second Josephson junctions has the same tunneling energy; and a second ring portion comprising the second Josephson junction in parallel with the plurality of first Josephson junctions between the two nodes.

6. The method of claim 5, further comprising operating one or more magnetic flux generation devices to generate an external DC magnetic flux through the superconducting ring of each of the plurality of SNAILs.

7. The method of claim 6, wherein the external DC magnetic flux is between $0.25\Phi_0$ and $0.50\Phi_0$, where $\Phi_0$ is the magnetic flux quantum.

8. The method of claim 2, wherein the frequency $\omega_q$ is between 5 GHz and 8 GHz.

9. The method of claim 8, wherein the frequency $\omega_q$ is between 5.5 GHz and 6.5 GHz.

10. The method of claim 2, wherein K is between 300 kHz and 400 kHz.

11. The method of claim 10, wherein K is between 310 kHz and 330 kHz.

12. A circuit quantum electrodynamics (cQED) system comprising:

a Kerr oscillator comprising a plurality of superconducting nonlinear asymmetric inductive elements (SNAILs) coupled to one another in series, each of the plurality of SNAILs comprising a plurality of first Josephson junctions coupled in series and a second Josephson junction coupled in parallel with the plurality of first Josephson junctions, each of the plurality of SNAILS having a transition frequency $\omega_q$; and an energy source configured to drive the plurality of SNAILs at a frequency $\omega_p$, wherein $\omega_p < 2\omega_q$.

13. The cQED system of claim 12, wherein $\omega_p = 2\omega_q + 2\Delta$, wherein $\Delta$ is an integer multiple of $-2K$, wherein K is a Kerr nonlinearity of the plurality of SNAILs of the Kerr oscillator.

14. The cQED system of claim 13, wherein the frequency $\omega_q$ is between 5 GHz and 8 GHz.

15. The cQED system of claim 13, wherein K is between 300 kHz and 400 kHz.

16. The cQED system of claim 12, further comprising a readout resonator coupled to the plurality of SNAILs of the Kerr oscillator.

17. The cQED system of claim 16, wherein the readout resonator has a resonant frequency $\omega_r$, and the energy source is further configured to drive the readout resonator at a frequency $\omega_r - \omega_p/2$ to thereby produce readout of a quantum state of the Kerr oscillator.

18. The cQED system of claim 12, further comprising a Purcell filter coupled to the plurality of SNAILs of the Kerr oscillator.

19. The cQED system of claim 12, wherein, within each of the plurality of SNAILs, the second Josephson junction is characterized by a superconducting phase difference, $\varphi$, wherein the SNAIL has a potential that varies as a function of the superconducting phase difference, $\varphi$, and has a single potential well, wherein the potential has a non-zero $\varphi^3$ term and a $\varphi^4$ term that is equal to zero.

20. The cQED system of claim 12, wherein each of the plurality of SNAILs comprises two first Josephson junctions.

21. The cQED system of claim 12, wherein, within each of the plurality of SNAILs, the first Josephson junction is formed from two Dolan bridges.

22. The cQED system of claim 12, wherein, within each of the plurality of SNAILs, a tunneling energy of the second Josephson junction is less than a tunneling energy of each of the first Josephson junctions.

23. The cQED system of claim 22, wherein the tunneling energy of each first Josephson junction is $E_J$, and the tunneling energy of each second Josephson junction is $\alpha E_J$, where $\alpha$ is less than 0.50 and greater than 0.20.

24. The cQED system of claim 12, wherein each of the plurality of SNAILs comprises a superconducting ring connected between two nodes, the superconducting ring comprising:

a first ring portion comprising the plurality of first Josephson junctions connected in series, wherein each second Josephson junction of the plurality of second Josephson junctions has the same tunneling energy; and a second ring portion comprising the second Josephson junction in parallel with the plurality of first Josephson junctions between the two nodes.

25. The cQED system of claim 24, further comprising one or more magnetic flux generation devices configured to generate an external DC magnetic flux through the superconducting ring of the each of the plurality of SNAILs.

26. The cQED system of claim 25, wherein the external DC magnetic flux generated by the one or more magnetic flux devices is between $0.25\Phi_0$ and $0.50\Phi_0$, where $\Phi_0$ is the magnetic flux quantum.

27. The cQED system of claim 12, wherein the Kerr oscillator is formed on a sapphire chip suspended within a cavity.

* * * * *